United States Patent [19]

Goela et al.

[11] Patent Number: 4,963,393

[45] Date of Patent: Oct. 16, 1990

[54] METHOD TO PREVENT BACKSIDE GROWTH ON SUBSTRATES IN A VAPOR DEPOSITION SYSTEM

[75] Inventors: Jitendra S. Goela, Andover, Mass.; Roy D. Jaworski, Exeter, N.H.; Raymond L. Taylor, Saugus, Mass.

[73] Assignee: CVD Incorporated, Woburn, Mass.

[21] Appl. No.: 403,957

[22] Filed: Sep. 7, 1989

[51] Int. Cl.$^5$ .................... C23C 16/00; C23C 16/04
[52] U.S. Cl. .................. 427/248.1; 427/249; 118/721; 118/728; 118/504; 118/505
[58] Field of Search ............ 427/248.1, 249; 118/505, 504, 721, 728

[56] References Cited

U.S. PATENT DOCUMENTS 4,448,797  5/1984  Burnham .................. 427/8
4,705,659  11/1987  Bernstein et al. ............ 264/29.6

*Primary Examiner*—Norman Morgenstern
*Assistant Examiner*—Roy V. King
*Attorney, Agent, or Firm*—Gerald K. White

[57] ABSTRACT

Backside growth on substrates in a vapor deposition system has been a problem resulting in cracking of the material deposited on the substrate, making replication in a vapor deposition system difficult to achieve, and requiring post deposition machining to separate the substrate-deposit from the deposition fixture. A solution to the problem is the following: the substrate is mounted on a plurality of graphite pillars, with the pillars being bonded to the substrate as near the periphery thereof as possible. A hollow body open on one side but closed on the other, and fabricated from GRAFOIL with graphite cement used as a bonding agent, is mounted on the pillars with the open end facing the substrate. The open end of the body is pressed against the substrate and sealed with a bonding agent. This completely covers the backside of the substrate and thus prevents any vapor deposition thereon.

3 Claims, 2 Drawing Sheets

METHOD TO PREVENT BACKSIDE GROWTH ON SUBSTRATES IN A VAPOR DEPOSITION SYSTEM

This invention was made with Government support under NASA Contract NAS1-18476 awarded by NASA. The Government has certain rights in this invention.

BACKGROUND OF THE INVENTION

1. Field of the Invention

This invention relates to a method of preventing backside growth on substrates in an impinging chemical vapor deposition system.

2. Description of the Prior Art

Backside growth on substrates in an impinging chemical vapor deposition system, if not prevented, often results in cracking of the deposit. Such growth also makes it difficult to achieve, in a vapor deposition system, replication of the figure and finish of preshaped structures. The presence of such growth is further disadvantageous in that post deposition machining is required to separate the substrate deposit from the deposition fixture. Backside growth on substrates thus is particularly detrimental in lightweight rapid optics fabrication.

A process is disclosed in application Ser. No. 389,248 filed Aug. 3, 1989 by J. T. Goela, M. A. Pickering and R. L. Taylor and assigned to the assignee of the present invention for fabricating, by vapor deposition, lightweight structures out of refractory materials. The methods and lightweight structures disclosed in that application, which application by reference is incorporated herein, involve a core to define the shape and size of each structure. The core is coated with an appropriate deposit, such as silicon carbide (SiC) or silicon (Si), to give the structure strength and stiffness and for bonding thereof to another surface, for example, the surface of a substrate comprising the faceplate of a mirror being fabricated.

In the fabrication of mirrors, graphite may be used to form a mandrel for replicating on a SiC faceplate. One side of the mandrel is optically fabricated, either as flat or as a convex spherical shape. The other side of the mandrel is lapped flat. The lapped side of the mandrel is bonded by means of pillars and graphite cement to a baffle plate in a vapor deposition reactor. The mandrel is then coated with multiple coats of a suspension of carbon in solvent, following which the surface of the mandrel is buffed or polished to make it as shiny as possible without significantly altering its figure. Deposition of SiC on the mandrel is then effected. Without separating the faceplate from the mandrel, the exposed SiC surface may be etched with hot potassium hydroxide (KOH) to improve bonding of graphite to SiC. A lightweight structure core is then fabricated from flat or curved graphite ribs, as disclosed in the aforementioned application for patent. After being bonded together with graphite cement, the lightweight structure core is bonded with graphite cement to the etched SiC surface of the mandrel. SiC is then deposited to enclose the lightweight structure core following which the baffle plate is separated from the baffle pillars. Controlled edging may be performed to remove excess SiC deposit. Using a blade, the interface between the graphite mandrel and the SiC faceplate may then be opened to recover the SiC coated mirror faceplate. The latter is then ready for Si coating.

Selective deposit to confine Si growth to only the front face of the SiC coated faceplate in the fabrication of the mirror surface is very important. This is for the reason, mentioned hereinbefore, that Si growth on the backside of the SiC faceplate is disadvantageous in that, if not prevented, cracking of the deposit on the front side often results, making replication in a vapor deposition system difficult to achieve, and additionally requiring post deposition machining to separate the substrate-deposit from the deposition fixture.

SUMMARY OF THE INVENTION

An object of the invention is to provide a facile, inexpensive method to prevent backside growth on substrates in a vapor deposition system.

Another object of the invention is to provide such a method that does not require any machining to remove excessive material.

A further object of the invention is to provide a method to selectively deposit SiC and Si in a chemical vapor deposition reactor.

A more specific object of the invention is to provide a method for preventing backside growth on a substrate in a vapor deposition reactor comprising the steps of:

(a) mounting the substrate on pillars made of suitable material, the pillars being supported by a baffle backplate in the vapor deposition reactor and bonded with a suitable bonding agent to the substrate as near the periphery of the substrate as possible, (b) fabricating from flexible graphite a hollow body that is compatible with the substrate and is open at one end but closed at the other end, using graphite cement as a bonding agent, (c) mounting the hollow body on the pillars with the open end facing the backside of the substrate, the interface of the closed end with the pillars being sealed, (d) pressing and sealing with a suitable bonding agent the open end of the hollow body against the substrate adjacent the periphery thereof, whereby during the vapor deposition process vapor deposition on the backside of the substrate is prevented with vapor deposition occurring on the hollow body, and (e) upon completion of the vapor deposition process removing the hollow body from the substrate by piercing and breaking up the hollow body by mechanical means.

In accomplishing these and other objectives of the invention, an appropriate substrate which may be of any shape (hexagonal, square, triangular, circular, etc.) and size is mounted on a sufficient number of pillars made of graphite or any other suitable material. The pillars are bonded with a suitable bonding agent to the substrate as near the periphery of the substrate as possible. An appropriate hollow body, open on one end but closed on the other and compatible with the substrate, is fabricated from flexible graphite, a graphite cloth made under the trade name "GRAFOIL" and commercially available from Union Carbide Corporation, Old Ridgebury Road, Danbury, Conn. 06817. The hollow body is then mounted on the pillars with the open end facing the backside of the substrate, with the interface of the closed end with the pillars being sealed. The open end of the body is pressed against the substrate and sealed thereto with a bonding agent. This arrangement completely covers the backside of the substrate and thus prevents any vapor deposition thereon during the vapor deposition process. Vapor deposition occurs, however, on the outer surface of the hollow body.

The hollow body with a vapor deposited coating thereon is readily removed from the substrate with no resulting damage to the substrate. Specifically, since GRAFOIL is quite flexible, the Si coated hollow body is readily broken into small pieces by using a piercing tool and a pair of pliers. Cracks produced in the coated GRAFOIL, while it is being removed from the substrate, do not propagate to the substrate. This is for the reason that the substrate is perpendicular to the GRAFOIL body, and GRAFOIL is flexible, and therefore, deforms as stresses develop due to material growth and any thermal expansion mismatch.

The various features of novelty which characterize the invention are pointed out with particularity in the claims annexed to and forming a part of the specification. For a better understanding of the invention, its operating advantages, and specific objects attained by its use, reference is made to the accompanying drawings and descriptive matter in which a preferred embodiment of the invention is illustrated.

BRIEF DESCRIPTION OF THE DRAWINGS

With this description of the invention, a detailed description follows with reference being made to the accompanying drawings which form part of the specification wherein.

DESCRIPTION OF THE PREFERRED EMBODIMENT

Figure 1:
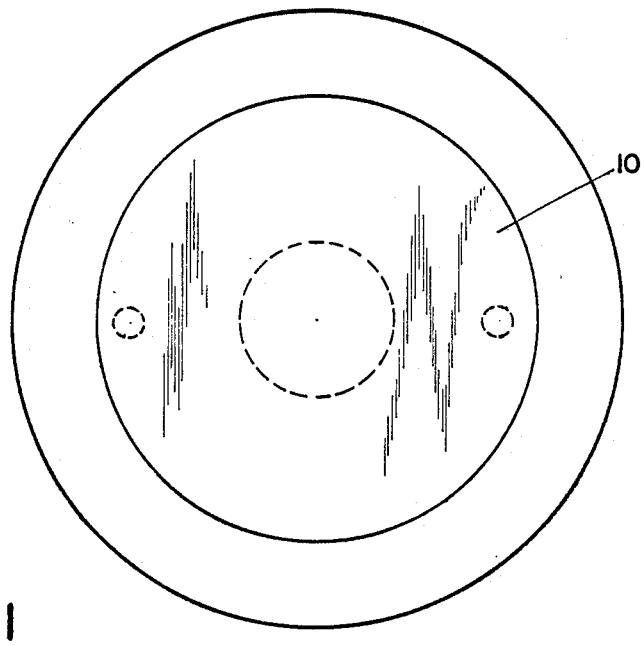
FIGS. 1 and 2 are top plan and side views, respectively, of a structure in accordance with the invention for preventing growth on the backside of a substrate in an vapor deposition system.
Figure 2:
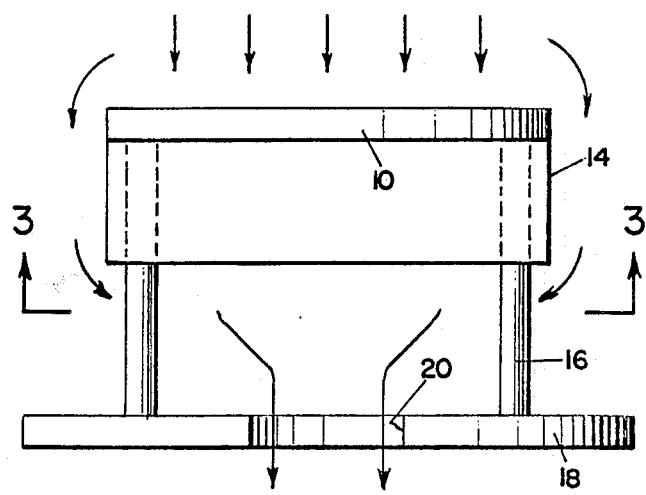
Figure 3:
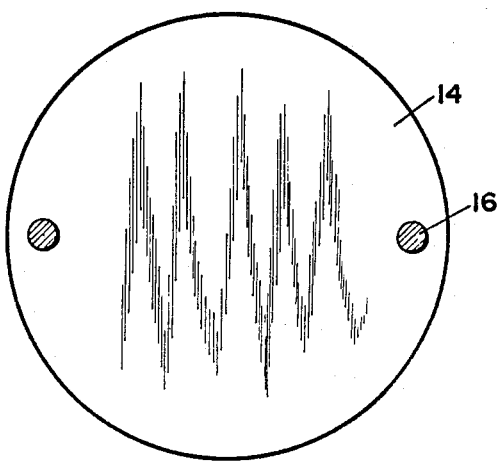
FIG. 3 is a sectional view taken along the lines 3—3 of FIG. 2.
Figure 4:
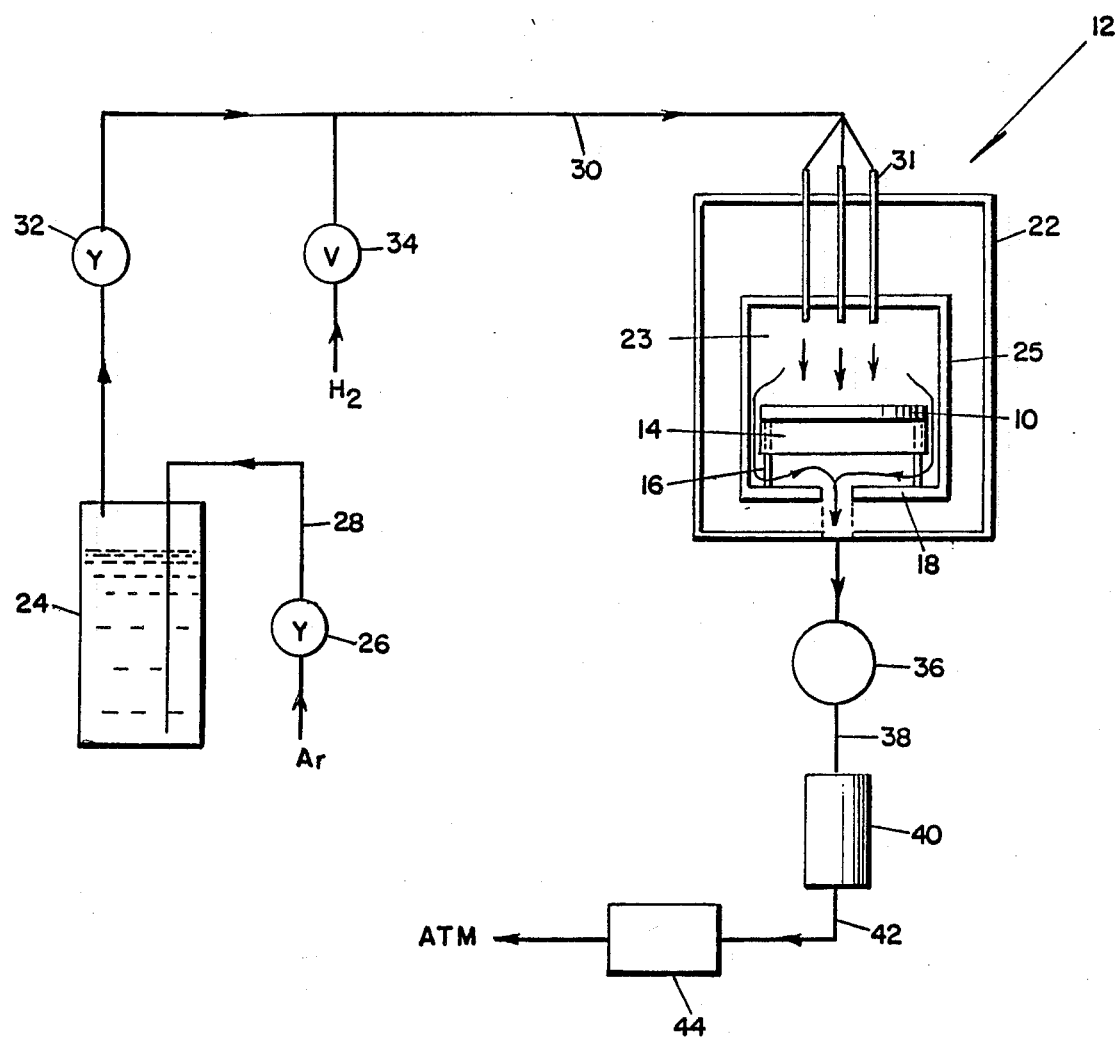
FIG. 4 is a schematic illustration of an impinging chemical vapor deposition system used to deposit refractory material on the substrate of FIG. 1.

FIG. 1 illustrates the method used to prevent growth on the backside of a circular SiC substrate 10 in an impinging chemical vapor deposition system which may be of a conventional type such as that designated 12 in FIG. 4. Substrate 10 may comprise the faceplate of a mirror being fabricated. As best seen in FIGS. 2 and 3, there is provided, in accordance with the invention, a hollow cylindrical body 14 which preferably is made of GRAFOIL, a flexible graphite, that is compatible with substrate 10. The hollow body 14 has substantially the same diameter as the substrate 10 and is open at one end but closed at the other. The hollow body 14 is mounted in cooperative relation with the substrate 10 on a plurality of pillars 16 of which, for convenience of illustration, two only are shown in the drawings. The pillars 16 are bonded with a suitable bonding agent to the substrate 10 as near the periphery thereof as possible. The open end of the hollow body 14 is positioned facing the backside of the substrate 10, with the pillars 16 extending through the closed end thereof in sealing relation therewith, being sealed with graphite cement. The pillars 16, in turn, are mounted on and supported by a baffle backplate 18 having a centrally located opening 20. The open end of the hollow body 14 is pressed against the substrate 10 and sealed there against with a suitable bonding agent (not shown). In FIG. 2 the arrows indicate the direction of flow relatively to the substrate 10, of the deposition vapor during the vapor deposition process.

With this arrangement, the backside of the substrate 10 is completely covered whereby during a Si vapor deposition process, vapor deposition on the backside of the substrate 10 is prevented. Vapor deposition of Si occurs, however, on the outer surface of the hollow body 14.

FIG. 4 schematically illustrates a chemical vapor deposition system that may be used for the selective deposit of SiC and Si on the substrate of FIGS. 1–3. As shown in FIG. 4, Argon enters a bubbler chamber 24 from a source (not shown) by way of a valve 26 and line 28. Chamber 24 may contain methyltrichlorosilane ($CH_3SiCl_3$) or trichlorosilane ($SiHCl_3$). Methyltrichlorosilane is preferred to produce a silicon carbide (SiC) deposit. Trichlorosilane is preferred to produce a silicon (Si) deposit. As those skilled in the art understand, however, other hydrocarbon and silane sources can be used to produce SiC and Si deposits. Both of these materials have been fabricated over a wide range of deposition temperature and reactor pressure, as described more fully in the aforementioned application for patent.

Argon bubbles carrying the reagent $CH_3SiCl_3$ or $SiHCl_3$ enter a line 30 under the control of a valve 32. Hydrogen enters the line 30 from a source (not shown) under the control of a valve 34. The reagents may be introduced into the reactor 22 through a central injector 31. Reactor 22 includes a conventional ceramic deposition chamber 23 contained within a reaction zone tube 25, which chamber 23 may be heated between about 830° and 1350° C. by suitable heating elements (not shown).

Gaseous products are removed from the reactor 22 through a filter 36 through a line 38 to a vacuum pump 40. From the vacuum pump 40, the gases are conveyed through a line 42 to a scrubber 44. The gases are then vented to the atmosphere.

Figure 5:
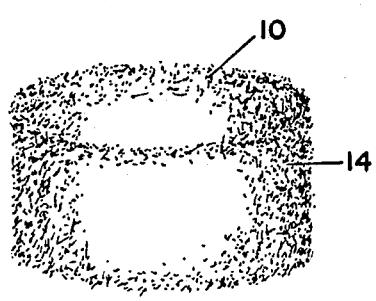
FIG. 5 illustrates an SiC substrate covered with a GRAFOIL body on the backside after completion of Si deposition.

In FIG. 5 there is illustrated a perspective view of the substrate 10 and GRAFOIL body 14 after the completion of Si deposition. Since GRAFOIL is quite flexible, the Si coated GRAFOIL is readily broken into small pieces by using a piercing tool and a pair of pliers. While removing the coated GRAFOIL, cracks do not propagate to the substrate 10 because the substrate 10 is perpendicular to the GRAFOIL body 14, and because GRAFOIL is flexible and therefore deforms as stresses develop due to Si growth and thermal expansion mismatch.

Thus, in accordance with the invention, there has been provided a method to selectively deposit SiC and Si in a chemical vapor deposition system. The method is unique in providing a facile and inexpensive way to prevent backside growth in a vapor deposition system and thus facilitate replication of the figure and finish of preshaped structures. The method is further characterized in that machining is not required to remove excessive material.

With this description of the invention in detail, those skilled in the art will appreciate that modifications may be made to the invention without departing from its spirit. Therefore, it is not intended that the scope of the invention be limited to the specific embodiment illustrated and described. Rather, it is intended that the scope of the invention be determined by the appended claims and their equivalents.

What is claimed is:

1. A method for preventing backside growth on a substrate in a vapor deposition reactor comprising the steps of:
   (a) mounting said substrate on pillars in said reactor,
   (b) fabricating from flexible graphite a hollow body that is compatible with the substrate and is open at one end but closed at the other end, using graphite cement as a bonding agent,
   (c) mounting the hollow body on the pillar in cooperative relation with the substrate with the open end thereof facing the backside of the substrate,
   (d) pressing and sealing the open end of the hollow body against the substrate closely adjacent the periphery thereof, and
   (e) upon completion of the vapor deposition process, removing the hollow body from the substrate by piercing the hollow body and breaking it up into pieces.

2. A method as defined by claim 1 wherein in step (b) the hollow body is fabricated from "GRAFOIL".

3. A method for preventing backside growth on a substrate in a vapor deposition reactor comprising the steps of:
   (a) mounting said substrate on pillars made of suitable material, said pillars being supported by a baffle backplate in the vapor deposition reactor and bonded with a suitable bonding agent to the substrate near the periphery thereof,
   (b) fabricating from flexible graphite a hollow body that is compatible with the substrate and is open at one end but closed at the other end, using graphite cement as a bonding agent,
   (c) mounting the hollow body on the pillars with the open end facing the backside of the substrate,
   (d) pressing and sealing the open end of the hollow body against the substrate adjacent the periphery thereof, whereby during the vapor deposition process vapor deposition on the backside of the substrate is prevented with vapor deposition occurring on the hollow body, and
   (e) upon completion of the vapor deposition process, removing the hollow body from the substrate by piercing and breaking up thereof by mechanical means.

* * * * *